(12) United States Patent
Aigner et al.

(10) Patent No.: US 7,288,435 B2
(45) Date of Patent: Oct. 30, 2007

(54) METHOD FOR PRODUCING A COVER, METHOD FOR PRODUCING A PACKAGED DEVICE

(75) Inventors: Robert Aigner, Unterhaching (DE); Martin Franosch, Munich (DE); Andreas Meckes, Munich (DE); Klaus-Guenter Oppermann, Holzkirchen (DE); Marc Strasser, Munich (DE)

(73) Assignee: Infineon Technologies AG, Munich (DE)

( * ) Notice: Subject to any disclaimer, the term of this patent is extended or adjusted under 35 U.S.C. 154(b) by 500 days.

(21) Appl. No.: 10/921,087

(22) Filed: Aug. 18, 2004

(65) Prior Publication Data

US 2005/0079686 A1  Apr. 14, 2005

Related U.S. Application Data

(63) Continuation of application No. PCT/EP03/00691, filed on Jan. 23, 2003.

(30) Foreign Application Priority Data

Feb. 19, 2002 (DE) .............................. 102 06 919.0

(51) Int. Cl.
*H01L 21/00* (2006.01)
*H01L 21/50* (2006.01)
*H01L 21/48* (2006.01)

(52) U.S. Cl. .......................... 438/118; 438/64; 438/68; 438/110; 438/458; 257/E21.503; 257/E23.119

(58) Field of Classification Search .................. 438/64, 438/68, 110, 118, 458
See application file for complete search history.

(56) References Cited

U.S. PATENT DOCUMENTS

| 5,668,033 A | 9/1997 | Ohara et al. |
| 6,316,287 B1* | 11/2001 | Zandman et al. ............ 438/113 |
| 6,332,568 B1* | 12/2001 | Christenson ................. 228/193 |
| 6,538,296 B1* | 3/2003 | Wan ............................ 257/415 |
| 6,639,299 B2* | 10/2003 | Aoki ............................ 257/531 |
| 6,709,893 B2* | 3/2004 | Moden et al. .............. 438/113 |
| 2001/0011857 A1 | 8/2001 | Morishima |

FOREIGN PATENT DOCUMENTS

| DE | 19619921 A 1 | 12/1996 |
| EP | 0 794 616 A2 | 9/1997 |
| EP | 0 805 552 A2 | 11/1997 |
| WO | WO95/30276 A1 | 11/1995 |
| WO | WO 01/59827 A1 | 8/2001 |

OTHER PUBLICATIONS

Lorenz, H. et al., "High-Aspect-Ratio, Ultrathick, Negative-Tone Near-UV Photoresist and Its Applications for MEMS", Sensors and Actuators A, 1998, pp. 33-39 (7 pages).

* cited by examiner

*Primary Examiner*—Alexander Ghyka
(74) *Attorney, Agent, or Firm*—Maginot, Moore & Beck

(57) ABSTRACT

In a method for producing a cover for a region of a substrate, first a frame structure is produced in the region of the substrate, and then a cap structure is attached to the frame structure so that the region under the cap structure is covered. Thus, sensitive devices may be protected easily and at low cost from external influences and particularly from a casting material for casting the entire packaged device, which results when a diced chip is cast.

13 Claims, 1 Drawing Sheet

METHOD FOR PRODUCING A COVER, METHOD FOR PRODUCING A PACKAGED DEVICE

CROSS-REFERENCE TO RELATED APPLICATION

This application is a continuation of copending International Application No. PCT/EP03/00691, filed Jan. 23, 2003, which designated the United States and was not published in English.

BACKGROUND OF THE INVENTION

1. Field of the Invention

The present invention relates to packaged devices and particularly to packaged devices containing mechanically sensitive components. A mechanically sensitive component or an active region, respectively, is, for example, an SAW or BAW filter or a micromechanical element.

2. Description of the Related Art

Micromechanical devices play an increasingly important role, particularly when considering rotation rate sensors, acceleration sensors, etc. Here, a mechanically active part such as a mass that is deflectable depending on acceleration, or a vibrator that may be put in stimulating vibration in a rotation rate sensor, or generally a sensor or actuator is packaged together with an integrated circuit for controlling and/or evaluating the device. Other elements whose characteristics are affected by a casting package, such as bulk acoustic wave filters (BAW filters) or surface acoustic wave filters (SAW filters), are also packaged either on their own or together with an integrated circuit for controlling or readout.

Typical packaging concepts, such as casting or molding in plastic or resin, are disadvantageous in that the mechanical properties of mechanically sensitive parts may be affected, or, like in the case of BAW or SAW filters, in that the material on the surface of the BAW resonators also has an influence on the characteristics of the filter.

For the protection of mechanical structures, wafers with corresponding structures, i.e. filters, resonators, sensors, or actuators, etc., have been bonded with a second wafer into which pits and holes are etched in the places of the structure, so that the pits of the second wafer form cavities over the sensitive structures of the first wafer and the holes in the second wafer (cap wafer) make contact pads of the first wafer accessible. Thereby the sensitive structures are protected. Alternatively, ceramic packages also are employed, which are, however, expensive.

SUMMARY OF THE INVENTION

It is the object of the present invention to provide a cost-effective, but nevertheless safe concept for packaging sensitive devices.

The present invention provides a method for producing covers for a plurality of regions on a system wafer, each region having a device, wherein contact pads for the devices are provided outside each region, the method including the steps of providing the system wafer having the devices; producing a frame structure for each region of the system wafer; wherein the step of producing further includes the substeps of spinning a photostructurable epoxy resin material onto the system wafer; exposing the photostructurable epoxy resin material; developing the photostructurable epoxy resin material; and removing the epoxy resin material defined by the exposure to obtain the frame structure for each region of the system wafer; the method further including the steps of providing a support wafer, wherein the support wafer has a sacrificial layer; producing a cap structure for attaching it to the frame structure so that the region between the cap structure and the system wafer is covered, wherein the step of producing further includes the substeps of spinning a photostructurable epoxy resin material onto the sacrificial layer on the support wafer; and structuring the photostructurable epoxy resin material to produce a cap structure; the method further including the steps of connecting the cap structure with the frame structure; and removing the sacrificial layer from the support wafer to separate the cap structure from the support wafer; wherein the substep of structuring occurs in the step of producing the cap structure prior to the step of removing the sacrificial layer or after the step of removing the sacrificial layer.

The present invention is based on the finding that a cover for a device that is sensitive in some way may be produced cost-effectively and compatible with the rest of the production process, if, instead of the one-piece implementation, a two-piece cover is formed using a frame structure on the system wafer on which the devices to be protected are also arranged, and a cap structure. The cap structure may be put onto the frame structure using a support wafer, whereupon the support wafer is removed, for example using a sacrificial layer, and the cap structure remains. In order to connect the cap structure and the frame structure, an adhesive layer may be employed, for example.

As a material for the frame structure and the cap structure, a photostructurable material and, in particular, a relatively thick epoxy resin is used. This epoxy resin, that is spun onto the wafer in a liquid state, is stable and easily processable in the cured state, may further be easily adhered and, as compared to a silicon wafer or a quartz wafer, is available at a considerably lower price. If the epoxy resin for the cap structure is arranged on the support wafer by means of a sacrificial layer, it has the further advantage that the sacrificial layer may be detached selectively so that only the cap layer remains on the system wafer and particularly on the frame structure of the system wafer. The selective detachability has the further advantage that the support wafer is not affected by the detaching process of the sacrificial layer and thus may be reused so that a further cost reduction is possible.

BRIEF DESCRIPTION OF THE DRAWINGS

Preferred embodiments of the present invention are explained in detail in the following with reference to the accompanying drawings, in which.

DESCRIPTION OF THE PREFERRED EMBODIMENTS

Figure 1:
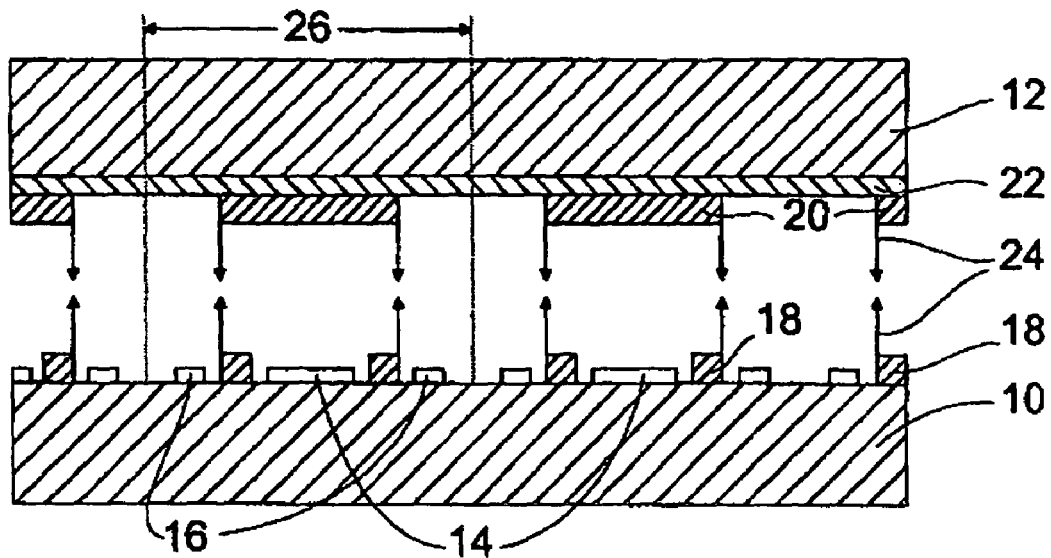
FIG. 1 is a cross section through a device according to the invention prior to joining a system wafer and a support wafer.

FIG. 1 depicts a system wafer 10 and a support wafer 12, wherein devices 14 that may be contacted via contact pads 16 are arranged on the system wafer 10. The devices 14 may either be applied to the system wafer 10 as discrete elements, for example by adhering, flip chip mounting, etc., or may be integrated in the system wafer 10. The devices are, for example, BAW or SAW filters, resonators, sensors, or actuators, or generally devices containing a region 14 that is to be protected, i.e. to be provided with a cover according to the invention. A frame structure 18 is arranged around the devices 14, that, depending on the application, either encloses the devices completely or, for example, encloses the devices only on two sides as viewed from above. The frame structure 18 may also be interrupted when it encloses the devices completely. It only has to be implemented in such a way that it may carry a cap structure 20. If the frame structure is interrupted, however, it does not protect against a casting mass so that, if protection against a casting mass is desired, an uninterrupted frame structure is preferred.

The cap structure 20 is mounted on the support wafer 12 by means of a sacrificial layer 22. A cover of the active regions of the devices 14 is achieved by putting the support wafer 12 on the system wafer in such an alignment as it is shown by arrows 24.

It is to be understood that, as is typical in semiconductor technology, wafer processing is preferred such that a large number of homogeneous chips is produced in one go and that then, after the production, dicing takes place. A chip is depicted by dashed lines and referred to as 26. In the scope of the present invention, a chip 26, i.e. an arrangement having a device to be protected and a frame, including a cap, formed around it, is also referred to as a packaged device.

Figure 2:
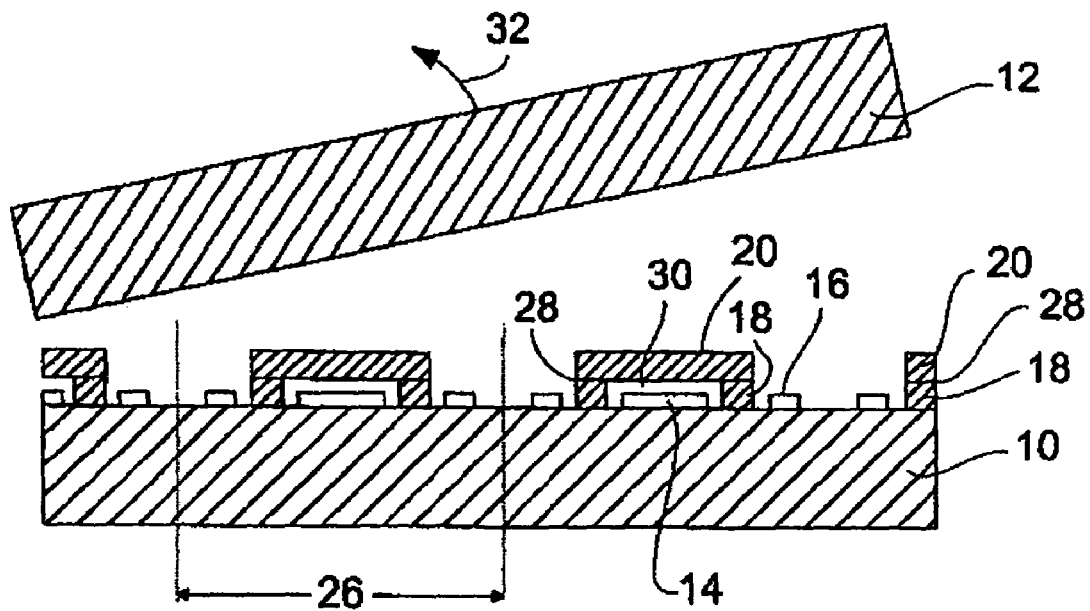
FIG. 2 is a cross section of the device according to the invention after joining the system wafer and the support wafer and after detaching the sacrificial layer.

FIG. 2 depicts the integrated circuit of FIG. 1, but after putting the support wafer 12 on the system wafer in a way that the cap structure 20 rests on the frame structure 18. For the cap structure and the frame structure to rest on each other, it is preferred to connect the frame structure and the cap structure by a bonding process. Alternatively, an adhesive layer 28 that serves to connect the cap structure 20 mechanically to the frame structure 18 as a connection layer may be applied either to the frame structure or to the cap structure at the respective places or over the full area.

It may be seen from FIG. 2 that, after putting on the support wafer and detaching the sacrificial layer 22 of FIG. 1, the support wafer may be taken off so that the active regions of the devices 14 are arranged in cavities 30 that result when the cap 20 is put on the frame 18. Finishing the chips 26 to a packaged device that may be employed in a system consists of dicing the wafer at the dotted lines, so that the individual chips 26 result, then putting the chip 26, for example, in a lead frame to lead the contact pads outwards with bonding wires, and then casting the chip with the contacted lead frame in plastic, resin, etc., to obtain a finished device.

The cover formed by the cap structure 20 and the frame structure 18 has the advantage that the casting mass is kept outside the cavity 30 so that the device 14 within the cavity 30 is not affected by the casting mass. On the one hand, this has the advantage that no mechanical parts are interfered with or made useless and that the environment, for example of a BAW or SAW filter, is also exactly defined, namely by the cavity 30 and the surrounding cover (cap 20 and frame 18) made of a known material that is previously known with respect to its geometry and nature and may be easily reproduced.

In a first embodiment for producing the system wafer, the devices 14 are processed in the system wafer 10 or, alternatively, applied thereon. Next, the frame structure 18 is provided on the system wafer by means of photolithographic methods, such that contact pads 16 for contacting the devices 14 are outside the frame structure so that they may still be contacted later. In flip chip mounting, the contact pads may also be arranged with their own frames, as islands, within the frame that encloses the active area of the chip.

As a material for the frame structure 18, photostructurable epoxy resin, such as SU-8, is preferred. Depending on the height of the active regions of the devices 14, the height of the frame structure 18, i.e. the distance of the upper edge of the frame structure 18 to the upper edge of the system wafer 10, must also be selected. Heights greater than 5 µm are possible for the frame structure made of photostructurable epoxy resin.

For the production of the support wafer, first a "bare" support wafer 12 is provided. Its full area is then covered with a sacrificial layer 22 to subsequently provide the cap structure 20 on the sacrificial layer 22. The cap structure 20 preferably also consists of photostructurable epoxy resin or a similar material.

All materials are preferred that may be easily applied, structured and later bonded and at the same time have a high stability in the completely processed state. Examples are photostructurable epoxy resin, photoimid, other polymers, or also metals.

The thickness of the cap structure 20 depends on the regions to be covered. If a very large device has to be covered, the cap structure 20 is selected thicker than if a relatively narrow, small device has to be covered. The thickness of the cap structure in a preferred embodiment of the present invention is more than 5 µm.

The frame has a preferred thickness of approximately 5-15 µm, the cap of approximately 25-50 µm. Here the relationship of thickness to span plays an important role and should be $\geq 1:20$. Typical thicknesses are 5-100 µm. Typical spans are 50-1000 µm, preferably 100-300 µm.

The structuring of the cap structure 20 and the frame structure 18 may occur in a similar way regarding the system wafer 10 and the support wafer 12. First, the epoxy resin is spun on like a conventional photoresist, is exposed and developed. In contrast to photoresist, however, the epoxy resin reaches a high and permanent hardness that at least allows the cover to resist the forces that occur when the chip is cast. When frame and cap are selected correspondingly stronger, a final casting of the circuit may be omitted. This, however, will depend on the individual application.

It is to be understood that the cap structure 20 is structured so that the contact pads remain free. It is not necessarily required that the edges of the cap structure are approximately flush with the edges of the frame structure, as long as the contact pads remain free for a later contacting and as long as a cavity 30 results that is sufficiently resistant against penetration of the casting mass or foreign substances. If the packaged device is to be applied in an aggressive environment, the system of frame and cover may, of course, be sealed hermetically (for example by vapor deposition of a metal layer).

The connection of the cap structure to the frame structure may be established either by means of an additional adhesive layer 28 or by bonding the cap structure on the frame structure. If, for example, caps and frames are made of epoxy resin, a particularly easy and low-cost connection results from the frames and/or caps not being completely cured (networked) in the structuring and thus remaining "sticky". By joining and completely networking (under contact pressure and increased temperature or photochemically initiated), a fixed connection is then accomplished.

If a fixed connection has been achieved between frame structure 18 and cap structure 20, the sacrificial layer 22 is detached in the method according to the invention in order to take off the support wafer afterwards, as depicted in FIG. 2 by an arrow 32.

As an alternative to the separate structuring of the support wafer 12 or the cap structure 20 on the support wafer 12, respectively, a support wafer 12 with a sacrificial layer 22 and a full-area cap layer 20 may also be used and may be put onto the frame structures 18 of the system wafer and be connected to the same to first detach the sacrificial layer and then take off the support wafer. Then a structuring of the cap structure has to occur to the effect that the same is removed in the regions where the contact pads 16 are located, for example by photostructuring techniques.

In both alternatives, the support wafer 12 may be reused for fulfilling the same function. This leads to a reduction of costs that may also be attributed to the fact that cheap epoxy resin may be used instead of expensive silicon or quartz wafers. Due to a more accurate structurability and lower derivative measures in connection with an appropriate bonding process, the connection of epoxy resin to epoxy resin requires less bonding area as compared to a silicon/silicon or silicon/glass bonding connection. This allows circuits to be arranged more densely on a wafer so that the circuit yield per given wafer size may also be increased.

The final construction of the chips to obtain a packaged device may then be performed in a standard plastic package, as explained above.

The present invention is advantageous in that photostructurable epoxy resin may be used for producing a cavity over sensitive devices, wherein the same is first applied to two different wafers, i.e. the system wafer and the support wafer, to then connect both wafers at the upper edge of the frame structure 18 and the lower edge of the cap structure 20, to then remove the support wafer after detaching the sacrificial layer 22 and reuse it for the production of a further covering structure.

As a material for the sacrificial layer, any materials may be used. For the present invention it is preferred to take a dissolvable or etchable sacrificial layer that is dissolvable or etchable in such a way that the support wafer 12 itself and the cap structure 20 after application to the frame structure (FIG. 2) are not or not significantly affected during dissolving/etching of the sacrificial layer. Examples for materials are plastic materials other than those for frames and caps, other resists, wax, or metals, dielectrics, etc. The only requirement is a chemical selectivity for the cap and frame material as well as for the upper layer with regard to dissolvability/etchability.

Another advantage of the present invention is that the packaging, i.e. producing the cover for the sensitive devices 14, already takes place at wafer level and not sequentially at individual devices.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for producing covers for a plurality of regions on a system wafer, each region comprising a device, wherein contact pads for the devices are provided outside each region, the method comprising:

providing the system wafer having the devices;
producing a frame structure for each region of the system wafer, wherein the step of producing a frame structure further comprises the following substeps:
spinning a first photostructurable epoxy resin material onto the system wafer;
exposing the first photostructurable epoxy resin material;
developing the first photostructurable epoxy resin material; and
removing the epoxy resin material defined by the exposure of the first photostructurable epoxy resin material to obtain the frame structure for each region of the system wafer;
providing a support wafer, wherein the support wafer comprises a sacrificial layer;
producing a cap structure for attaching to the frame structure so that the region between the cap structure and the system wafer is covered, wherein the step of producing a cap structure further comprises the following substeps:
spinning a second photostructurable epoxy resin material onto the sacrificial layer on the support wafer; and
structuring the second photostructurable epoxy resin material to produce the cap structure;
connecting the cap structure to the frame structure; and
removing the sacrificial layer from the support wafer to separate the cap structure from the support wafer.

2. The method of claim 1 wherein the substep of structuring the second photostructurable epoxy resin occurs in the step of producing the cap structure prior to the step of removing the sacrificial layer.

3. The method of claim 1 wherein the substep of structuring the photostructurable epoxy resin occurs in the step of producing the cap structure after the step of removing the sacrificial layer.

4. The method of claim 1 wherein the step of connecting the cap structure to the frame structure comprises bonding the cap structure and the frame structure.

5. The method of claim 1 wherein the step of connecting the cap structure to the frame structure comprises adhering the cap structure and the frame structure.

6. The method of claim 1 wherein the device is an electronic device.

7. The method of claim 1 wherein the device is an electromechanical device.

8. The method of claim 1 wherein the device is a micromechanical device.

9. The method of claim 1 wherein the first photostructurable epoxy resin material is the same material as the second photostructurable epoxy resin material.

10. The method of claim 1 wherein the first photostructurable epoxy resin material or the second photostructurable epoxy resin material is epoxy resin of the type SU-8.

11. The method of claim 1 wherein the frame structure has a height of more than 5 μm.

12. The method of claim 1 wherein the cap structure has a height of more than 5 μm.

13. The method of claim 1 further comprising the step of arranging a casting material around the frame structure, but not within the frame structure.

* * * * *